United States Patent [19]

Green et al.

[11] Patent Number: 5,327,394

[45] Date of Patent: Jul. 5, 1994

[54] TIMING AND CONTROL CIRCUIT FOR A STATIC RAM RESPONSIVE TO AN ADDRESS TRANSITION PULSE

[75] Inventors: Robert S. Green; Larren G. Weber, both of Boise, Id.

[73] Assignee: Micron Technology, Inc., Boise, Id.

[21] Appl. No.: 831,452

[22] Filed: Feb. 4, 1992

[51] Int. Cl.[5] .............................................. G11C 7/02
[52] U.S. Cl. ........................... 365/233.5; 365/189.08; 365/230.01; 365/233; 307/480
[58] Field of Search ..................... 365/189.08, 230.01, 365/230.06, 233, 233.5; 307/480

[56] References Cited

U.S. PATENT DOCUMENTS

| | | | |
|---|---|---|---|
| 4,636,991 | 1/1987 | Flannagan et al. | 365/233.5 |
| 4,661,931 | 4/1987 | Flannagan et al. | 365/203 |
| 4,744,063 | 5/1988 | Ohtani et al. | 365/233 |
| 4,827,454 | 5/1989 | Okazaki | 365/233.5 |
| 4,947,379 | 8/1990 | Okuyama | 365/233.5 |
| 5,025,422 | 6/1991 | Moriwaki et al. | 365/233.5 |
| 5,159,574 | 10/1992 | Kim et al. | 365/233.5 |
| 5,198,708 | 3/1993 | Gillingham | 307/480 |
| 5,198,709 | 3/1993 | O'Connell | 307/480 |
| 5,268,873 | 12/1993 | Suzuki | 365/233.5 |
| 5,268,874 | 12/1993 | Yamauchi | 365/233.5 |
| 5,295,117 | 3/1994 | Okada | 365/233.5 |

OTHER PUBLICATIONS

Micron Technology, Inc., "MOS Data Book", Jan. 1991, pp. 4–151 to 4–164.

*Primary Examiner*—Eugene R. LaRoche
*Assistant Examiner*—Andrew Q. Tran

[57] ABSTRACT

An SRAM having an input address bus, a memory array and coupled sense amplifiers, internal sense amp enable and output data bus enable nodes further includes a circuit for generating an asynchronous address transition signal from a series of address signals received on the input address bus, and a timing and control circuit. The timing and control circuit selects a single address signal and suppresses the other address signals within a predetermined period of time such as the normal cycle time of the SRAM. If the address transition signal includes a pulse train of two or more pulses spaced apart by less than the predetermined time interval, the timing and control circuit generates fixed pulse width sense amp enable and output data bus enable signals corresponding to the last pulse in the pulse train. If the pulses are spaced apart by more than the predetermined time interval, the timing and control circuit generates fixed pulse width sense amp enable and output data bus enable signals corresponding to each pulse in the pulse train of the address transition signal. If the address transition signal is a single pulse having a variable pulse width related to the number of different address signals received on the address bus, the timing and control circuit generates fixed pulse width sense amp enable and output data bus enable signals corresponding to the single pulse of the address transition signal.

6 Claims, 9 Drawing Sheets

TIMING AND CONTROL CIRCUIT FOR A STATIC RAM RESPONSIVE TO AN ADDRESS TRANSITION PULSE

BACKGROUND OF THE INVENTION

This invention relates generally to memory circuits and more particularly to a timing and control circuit for generating output data bus enable and sense amp enable signals for a static random access memory circuit ("SRAM").

The basic structure of an SRAM is well known in the art to include an input address bus, a memory array constructed of rows and columns of static memory cells having inputs and outputs coupled to corresponding row and column lines. Individual memory cells are addressed by energizing appropriate row and columns line for either reading data into the selected memory cell or for reading data out onto a column line. Sense amplifiers are coupled to the column lines for sensing the small changes in charge developed on the column lines. The sense amplifiers are not always active and consuming power, but are activated by a sense amp enable signal at an appropriate time in a sequence of events necessary for reading data out of the memory. Typically, many sense amplifiers are coupled to an internal output data bus, which is also activated by a bus enable signal. The bus enable signal is usually activated slightly after the sense amp enable signal.

A basic feature of most SRAM memory circuits is an input latch to provide two modes of addressing. In a first, synchronous address mode, an input latch is activated and latches a single address signal. Subsequent received address signals are ignored and only the registered address is further processed to either write data into or read data out of a memory cell. In a second, asynchronous address mode, the input latch is transparent to the address signals. Each new address signal is processed as it is received on the input address bus. Further details of the internal structure and operation of an SRAM are set forth in the 1991 MOS DATA BOOK of MICRON TECHNOLOGY, INC. of Boise, Id. The description at pp. 4-151 through 4-164 of the data book is especially pertinent and is hereby incorporated by reference.

While the asynchronous address mode is a useful feature in many applications, where a clock edge is not available when the address is valid, for example, repeatedly changing the address signal within the normal cycle time of the memory can create problems. The memory circuit, in responding to each address signal, initiates a sequence of events such as enabling the sense amplifiers and internal output data bus, as well as precharging and equalizing internal busses, decoding row and column addresses, releasing precharge and equalization levels, and other steps necessary to read or write data into or out of the memory array. If a subsequent address signal is received too soon after an initial address is received, the sequence of events is aborted and restarted in response to the new address signal. While the subsequent address signal is processed, doing so increases noise at the output due to the unnecessary switching of internal nodes and busses, increases power dissipation due to sense amplifiers and busses being unnecessarily activated, and reduces operating speed by requiring full logic swings on the internal nodes.

Therefore, what is desired is a control and timing circuit for an SRAM placed in an asynchronous address mode to select a single address amongst several addresses received within the normal cycle time interval of the SRAM.

SUMMARY OF THE INVENTION

It is, therefore, a principal object of the invention to provide a timing and control circuit for an SRAM capable of selecting and acting upon a single address out of a plurality of addresses received within a predetermined time interval such as the normal cycle time interval of the SRAM.

An advantage of the invention is that noise is reduced in the SRAM during the asynchronous address mode.

Another advantage of the invention is that power consumption is reduced in the SRAM during the asynchronous address mode.

A further advantage of the invention is that operating speed is increased in the SRAM during the asynchronous address mode.

According to the present invention, an SRAM having an input address bus, a memory array and coupled sense amplifiers, internal sense amp enable and output data bus enable nodes further includes a circuit for generating an asynchronous address transition signal from a series of address signals received on the input address bus, and a timing and control circuit. The timing and control circuit selects a single address signal and suppresses the other address signals within a predetermined period of time such as the normal cycle time of the SRAM. If the address transition signal includes a pulse train of two or more pulses spaced apart by less than the predetermined time interval, the timing and control circuit generates fixed pulse width sense amp enable and output data bus enable signals corresponding to the last pulse in the pulse train. If the pulses are spaced apart by more than the predetermined time interval, the timing and control circuit generates fixed pulse width sense amp enable and output data bus enable signals corresponding to each pulse in the pulse train of the address transition signal. Similarly, if the address transition signal is a single pulse having a variable pulse width related to the number of different address signals received on the address bus, the timing and control circuit generates fixed pulse width sense amp enable and output data bus enable signals corresponding to the single pulse of the address transition signal.

The foregoing and other objects, features and advantages of the invention will become more readily apparent from the following detailed description of a preferred embodiment of the invention which proceeds with reference to the accompanying drawings.

DETAILED DESCRIPTION

Figure 1:
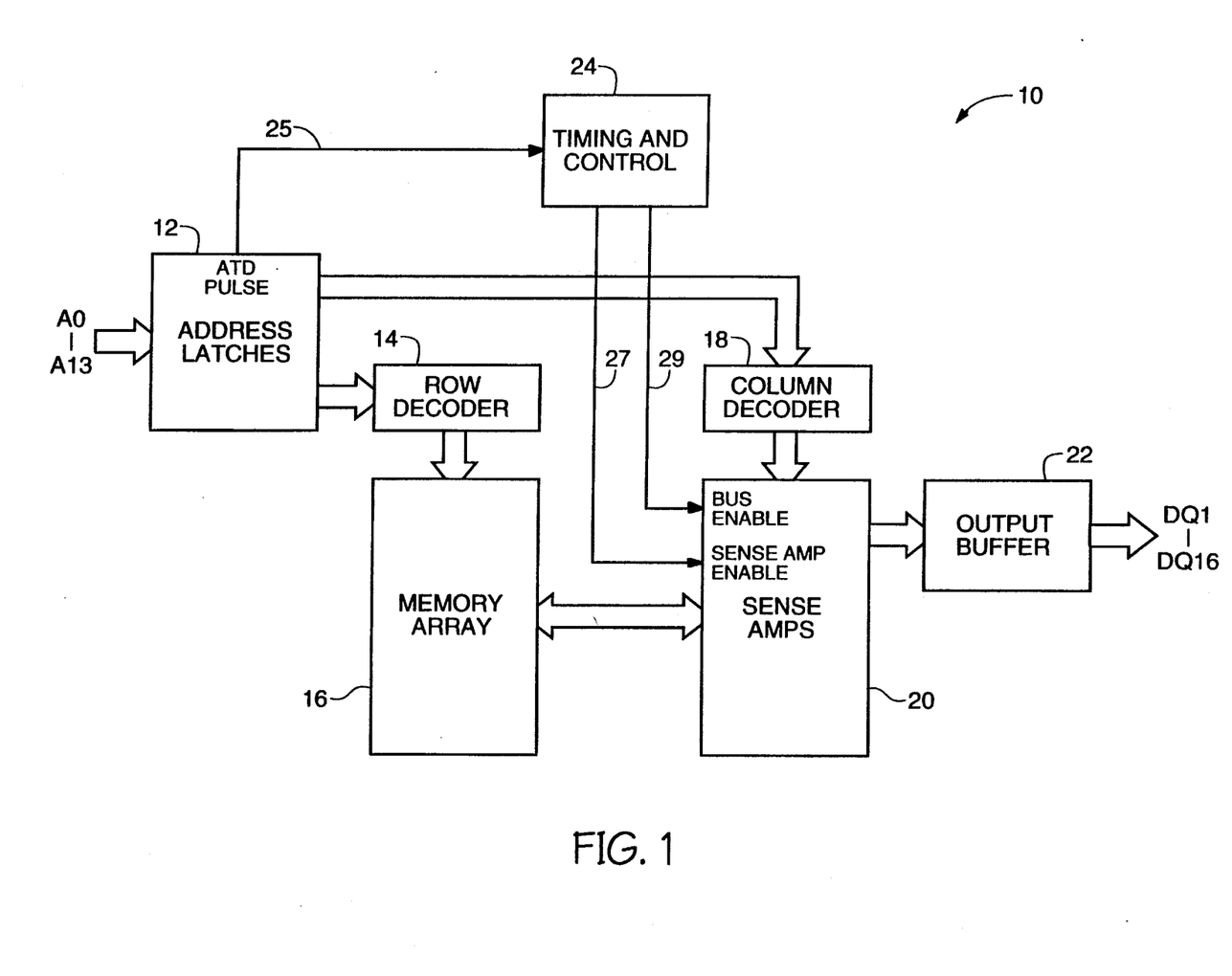
FIG. 1 is a simplified block diagram of an SRAM showing the address transition pulse generator and timing and control circuit of the present invention.

A simplified block diagram (generally excluding the blocks necessary for writing data into the memory array) of an SRAM 10 is shown in FIG. 1. In pertinent part, SRAM 10 includes an address latch and address transition detection pulse generator 12. The address latch/pulse generator 12 receives a composite address signal designated A0-A13 on an input address bus and converts this address signal into row and column address on the seven bit row and column busses. The row and column address are decoded for selecting rows and columns in a memory array 16 through row decoder 14 and column decoder 18. The decoded row address is used directly to select a row in the memory array 16, whereas the column address is used indirectly to select a column in the memory array 16 through the sense amplifiers 20. Once data has been read out of the memory array 16 and sensed by the sense amplifiers 20, the data is loaded onto an internal output data bus and temporarily stored in an output buffer 22 until clocked out on the external output data bus labeled DQ1-DQ16.

The address latch 12 also includes an address transition detection pulse ("ATD" pulse or address transition pulse) generator for generating the address transition pulse on conductor 25. The ATD pulse generator can be of conventional design. For example, the ATD pulse generator can be an address decoder and multiple input logic gate such that a pulse is generated whenever any of the address bits change with the sequentially received address signals. Other pulse generators can be substituted, but it is desirable that such pulse generators generate a fixed pulse width pulse upon an address bit changing logic state.

The output of the address transition pulse generator 12 is thus a series of pulses spaces apart by a time interval corresponding to changes in the address signal on the input address bus A0-A13. If an initial address is received followed by widely spaced subsequent address, the output of the pulse generator 12 is a pulse train of widely spaced ATD pulses. If the subsequent address are received at a faster rate, the duty cycle of the pulse train increases to produce a series of narrowly spaced ATD pulses. In the extreme case, the output of the ATD pulse generator 12 is a single, wide ATD pulse wherein the pulse width corresponds to a series of address changes made in an extremely short time interval, i.e. shorter than the time interval chosen for the fixed output pulse of the pulse generator 12.

The ATD pulse or series of pulses are received by the input of the timing and control circuit 24. The ATD pulse either drives the input of the control circuit 24, or is slightly delayed, depending upon the architecture of the SRAM 10, as is described in further detail below. The timing and control circuit has two outputs, the sense amp enable signal and internal data bus enable signal, which are received by the sense amplifier block 20 on conductors 27 and 29.

Figure 2:
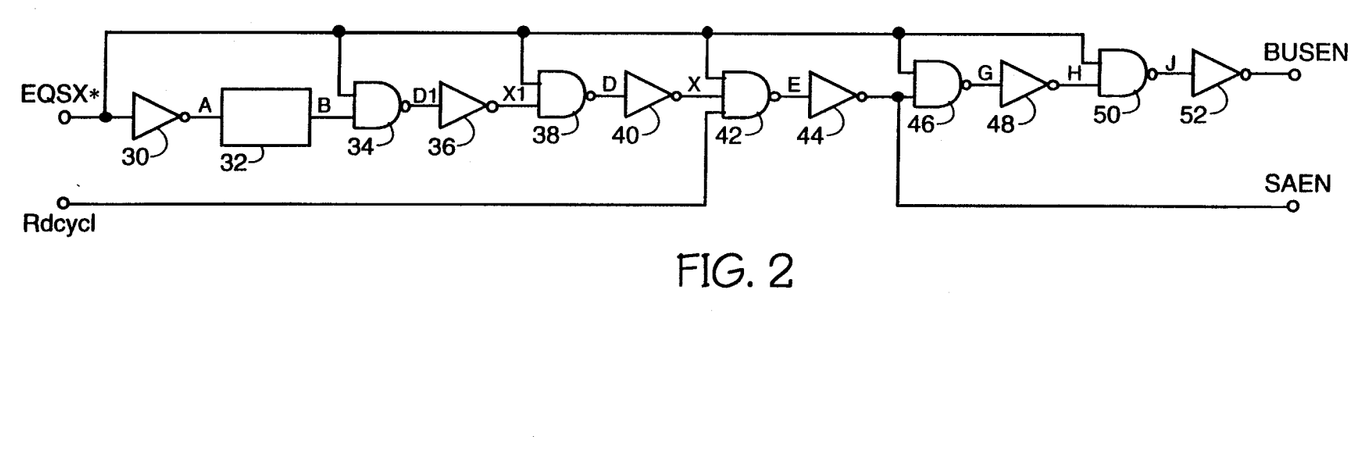
FIG. 2 is a schematic diagram of a portion of the timing and control circuit of the present invention.

The timing and control circuit 24 of FIG. 1 is shown in greater detail in schematic form in FIG. 2. Control circuit 24 includes an inverter 30 having an input for receiving the address transition signal and an output labeled A. The input signal to the inverter 30 is labeled EQSX*. This label denotes that the original ATD pulse is delayed and inverted, and that it is used for other functions in the SRAM 10, namely equalization of column lines, among others. The exact amount of delay to the input of the inverter depends upon the speed of the SRAM architecture in which the control circuit 24 is used. A delay generator 32 has an input coupled to the output of the inverter and an output labeled B. The delay of the delay generator 32 is set to about two nanoseconds. The exact delay time can be changed for each particular application. The operation of the control circuit 24 is described in further detail below in conjunction with timing diagrams 3-9. At least one AND gate such as the serial combination of NAND gate 34 and inverter 36 has a first input coupled to the output of the delay generator 32, a second input for receiving the EQSX* signal, and an output for eventually generating fixed pulse width sense amp enable and output bus enable signals at nodes labeled SAEN and BUSEN. The combination of a two-input NAND gate in series with an inverter shown in FIG. 2 is ideally suited for a CMOS implementation. A single two-input AND gate can be used in other logic families if desired. The timing and control circuit 24 can also receive other gating control signals in addition to the EQSX* signal, which is derived from the ATD pulse. For example, NAND gate 42 includes a third input for receiving a gating control signal labeled Rdcycl (read cycle). The bus enable and sense amp enable signals are not generated until the Rdcycl signal is of the proper logic polarity, as is further described below. It is desirable that the bus enable and sense amp enable signals not be pulsed during a write cycle.

In addition to the AND gate 34, 36, control circuit 24 includes a plurality of serial coupled AND gates 38, 40; 42, 44; 46, 48; and 50, 52, wherein each AND gate has a first input coupled to the output of the previous AND gate and a second input for receiving the EQSX* signal. Thus, a first AND gate 34, 36 has a first input coupled to the output of the delay generator 32, a second input for receiving the EQSX* signal, and an output labeled X1. A second AND gate 38, 40 has a first input coupled to the output of the first AND gate 34, 36, a second input for receiving the EQSX* signal, and an output labeled X. A third AND gate 42, 44 has a first input coupled to the output of the second AND gate 38, 40, a second input for receiving the EQSX* signal, a third input for receiving the Rdcycl, and an output for generating the fixed pulse width sense amp enable signal labeled SAEN. A fourth AND gate 46, 48 has a first input coupled to the output of the third AND gate 42, 44, a second input for receiving the EQSX* signal, and an output labeled H. A fifth AND gate 50, 52 has a first input coupled to the output of the fourth AND gate 46, 48, a second input for receiving the EQSX* signal, and an output for generating the fixed pulse width internal data output bus enable signal labeled BUSEN.

In operation, the timing and control circuit 24 of the present invention generates an asynchronous address transition signal from a series of address signals received on the input address bus. The address transition signal including a pulse train of two or more pulses, or a single pulse having a pulse width related to the number of changing address bits within a short fixed period of time. If the pulses of the address transition signal are spaced apart by less than a predetermined time interval, such as the normal cycle interval of the memory, the timing and control circuit 24 generates fixed pulse width sense amp enable and output data bus enable signals corresponding to the last pulse in the pulse train of the address transition signal. If the pulses are spaced apart by more than the predetermined time interval, the timing and control circuit 24 generates a fixed pulse width sense amp enable and output data bus enable signals corresponding to each pulse in the pulse train of the address transition signal. If the address transition signal is a single pulse having a variable pulse width related to the number of different address signals received on the address bus, the timing and control circuit 24 of the present invention generates fixed pulse width sense amp enable and output data bus enable signals corresponding to the single pulse of the address transition signal, regardless of the pulse width.

In addition to providing the fixed pulse width bus enable and sense amp enable signals, the control circuit 24 includes the capability of synchronizing the sense amp enable and bus enable signals with other gating control signals in addition to the address transition signal. For example, referring to FIG. 2, the read cycle signal, Rdcycl, allows generation of the sense amp enable and bus enable signals only if Rdcycl is at a logic high level, i.e. the memory being in the read mode.

Figure 3:
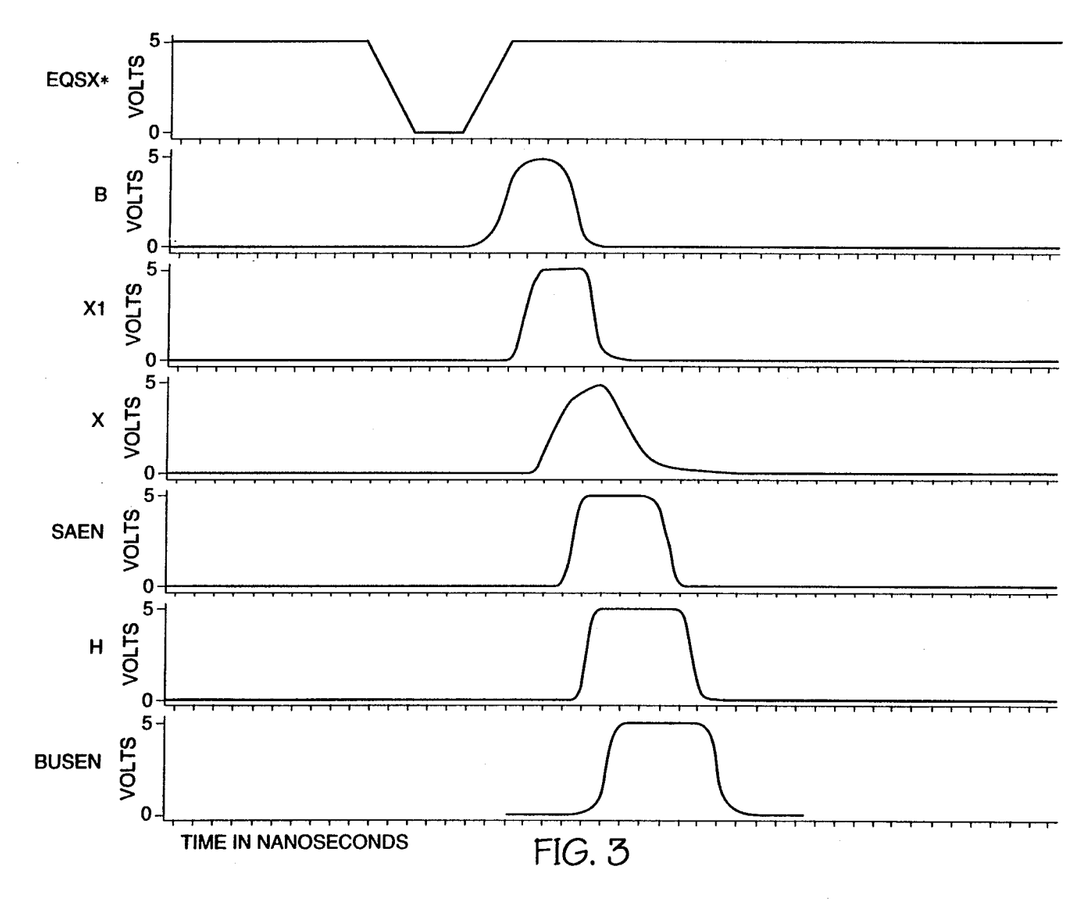
FIGS. 3-9 are plots of signals at various nodes identified in the circuit of FIG. 2, which illustrate several operation modes of the timing and control circuit of the present invention.
Figure 4:
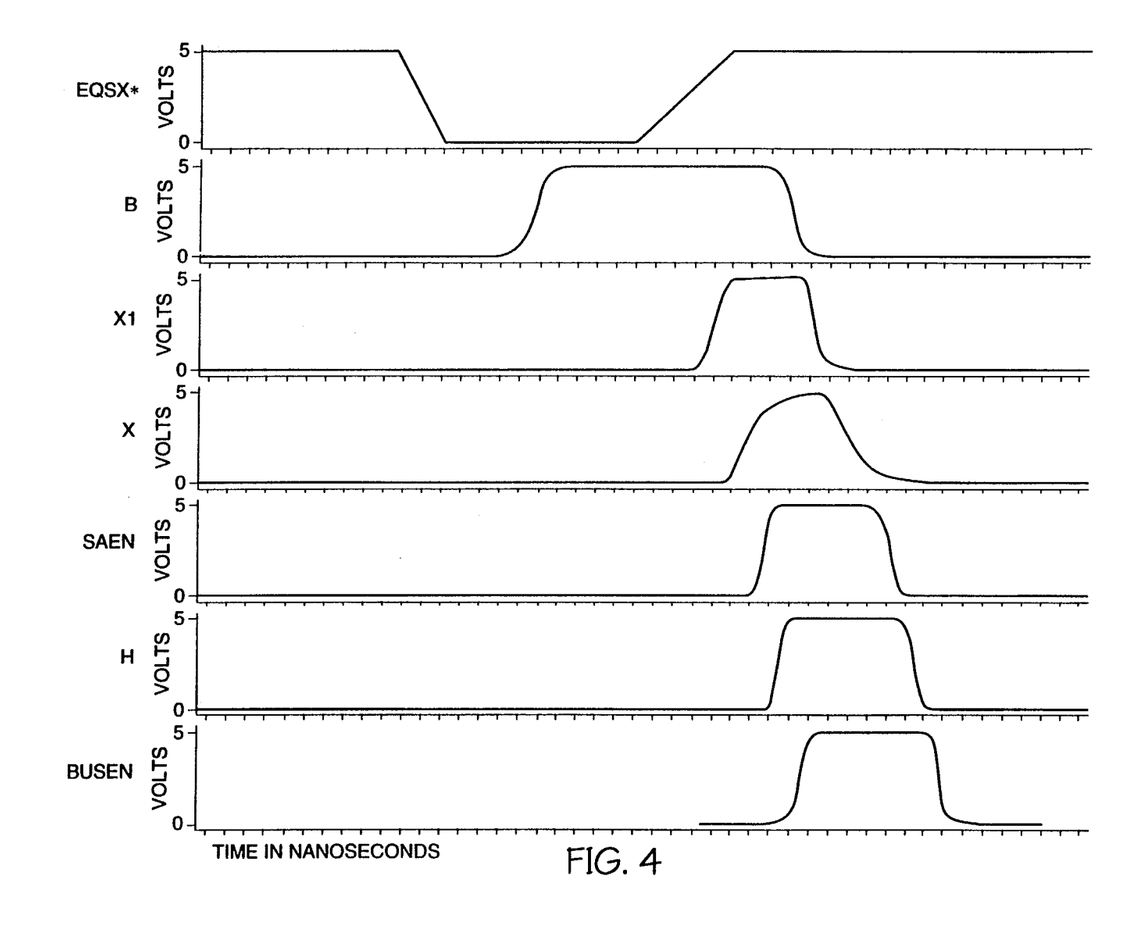
Figure 5:
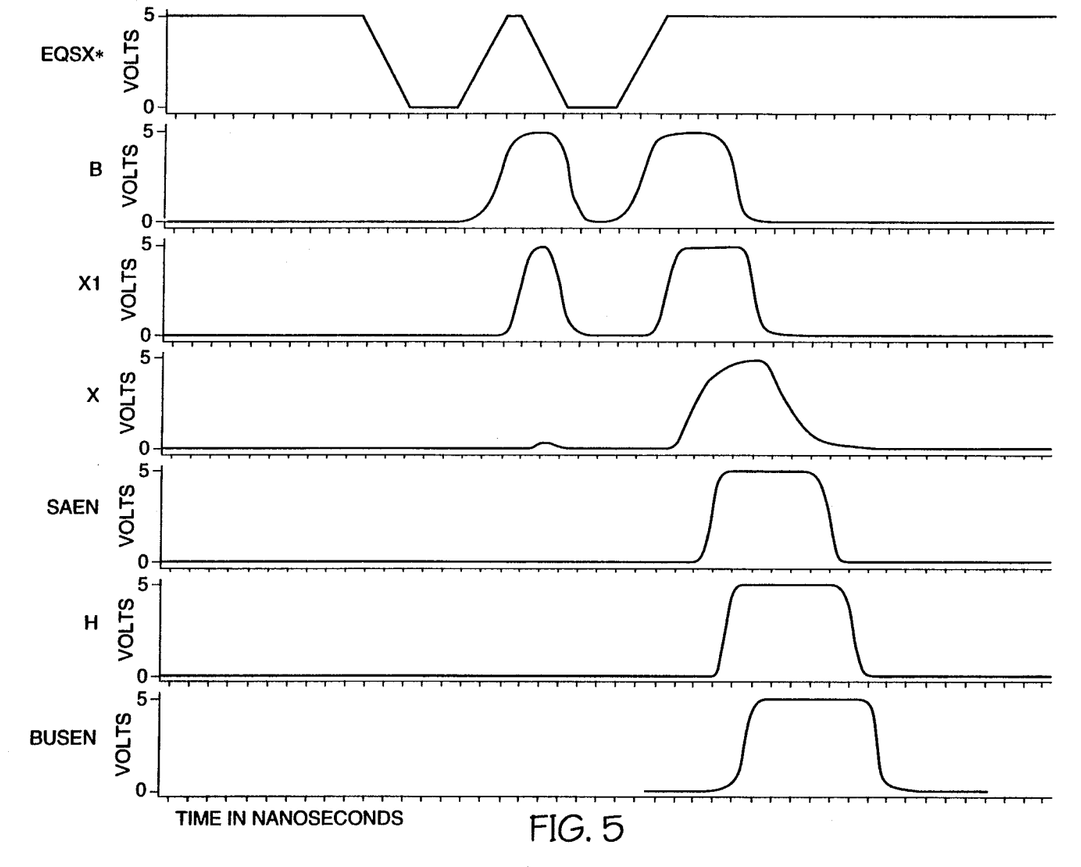
Figure 6:
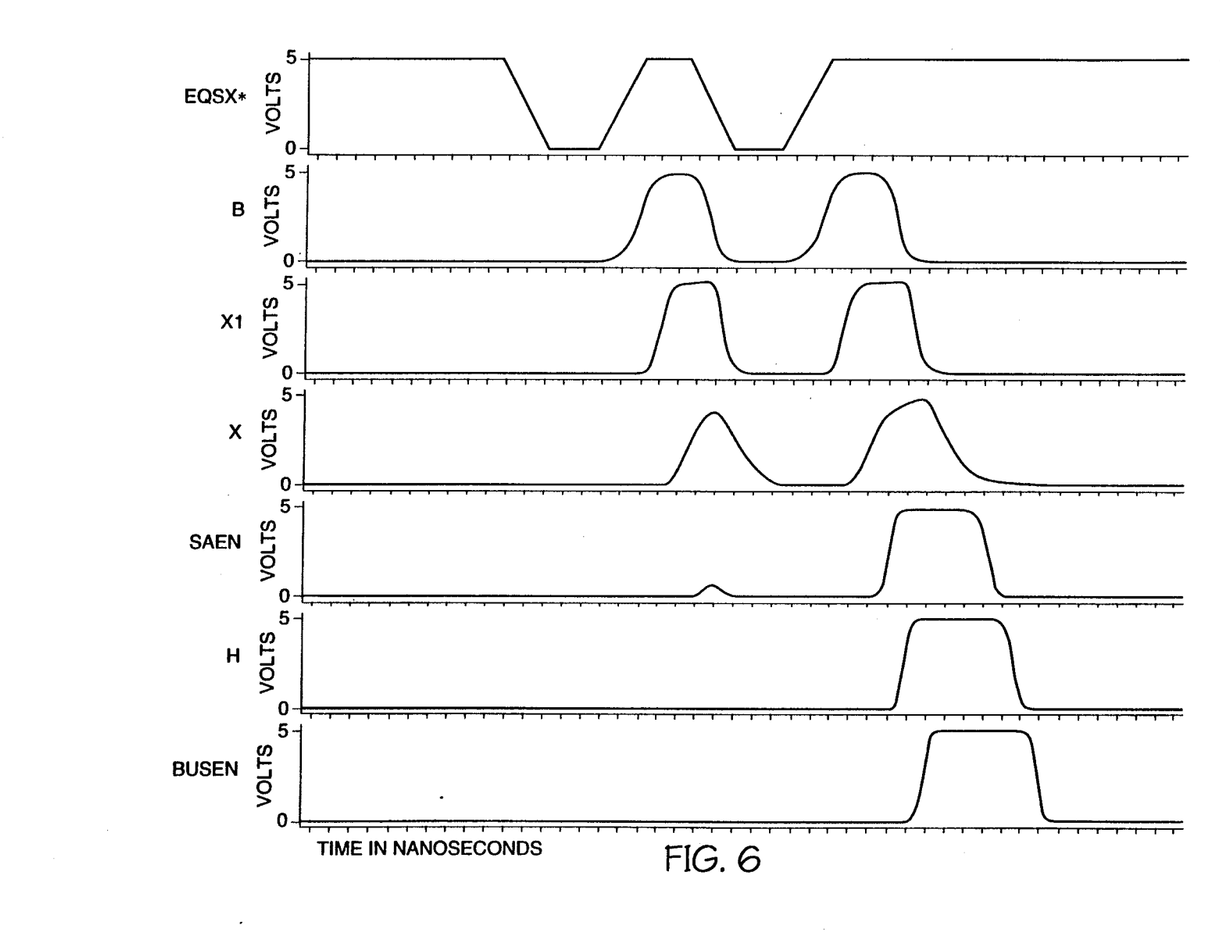
Figure 7:
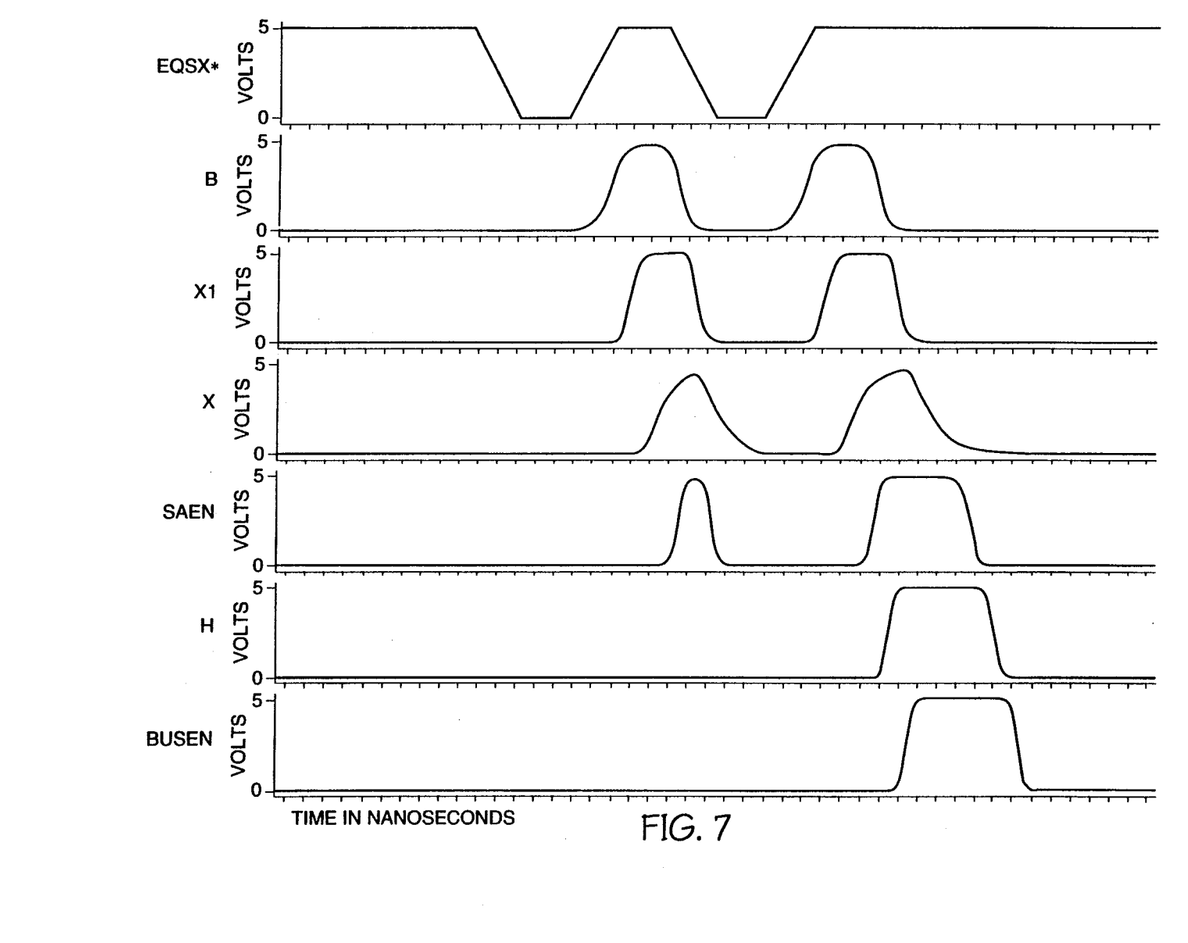
Figure 8:
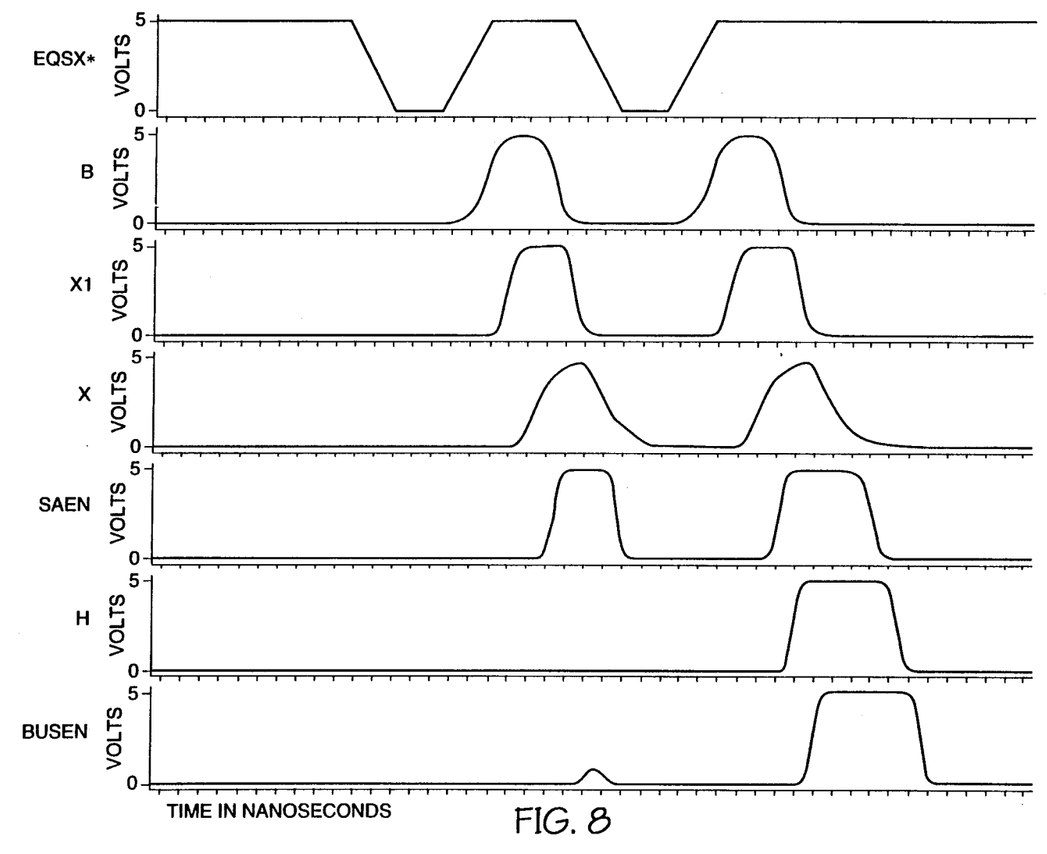
Figure 9:
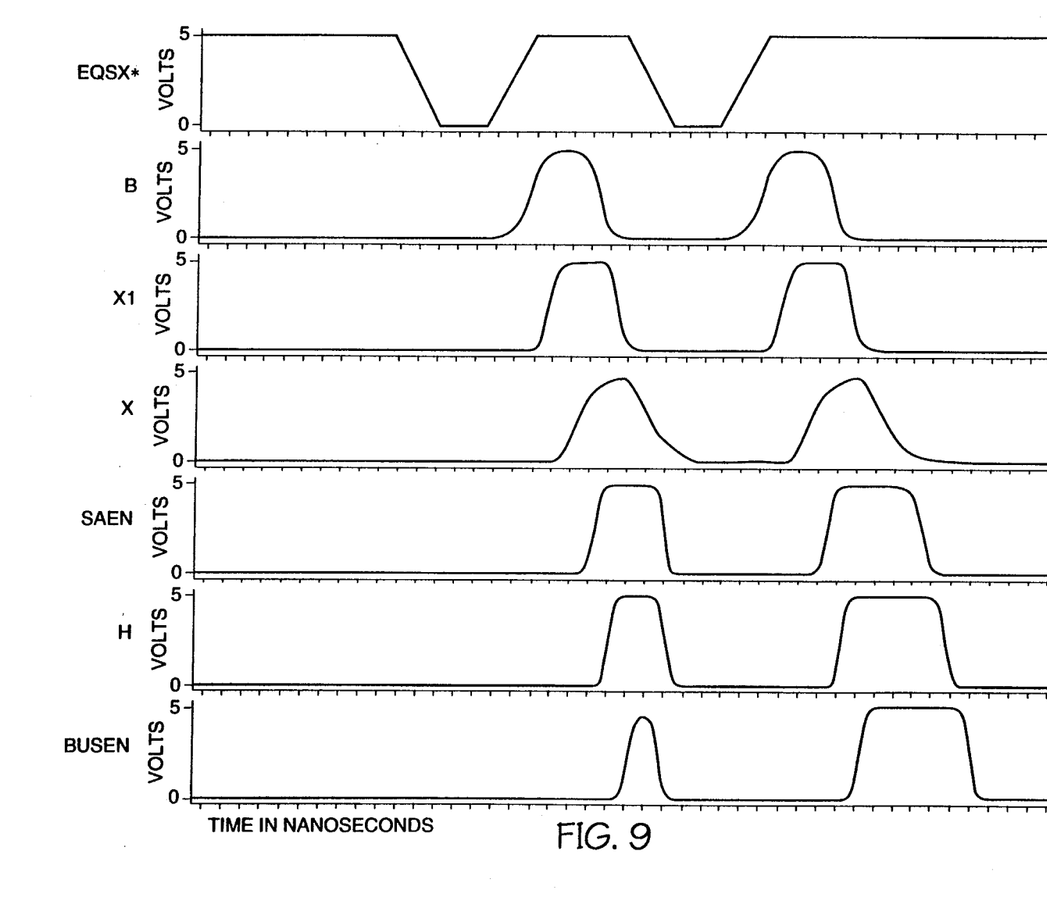

Referring now to FIGS. 3–9, various operational modes of the control circuit 24 are illustrated by showing the waveforms at various circuit nodes identified in FIG. 2. The signals have amplitudes in units of volts, and the time scale is in nanoseconds. FIG. 3 illustrates the normal operational mode, wherein, a single address signal is received, with subsequent address signal occurring at intervals greater than the normal read cycle interval of the memory. In this operational mode, the EQSX* signal goes low in response to the address transition signal. The EQSX* pulse is inverted and is propagated through the control circuit 24, providing substantially constant pulse width signals at circuit nodes B, X1, X, SAEN, H, and BUSEN. FIG. 4 illustrates an operational mode wherein a great number of address signals are received in a short time interval, approximately 15 nanoseconds. In this case, a single EQSX* pulse having a 15 nanosecond pulse width is generated. A delayed and inverted pulse is formed at circuit node B. The pulse is delayed approximately 5 nanoseconds to form a constant pulse at circuit node X1, since X1 represents the logical AND function of the waveforms at nodes EQSX* and B. The constant pulse width waveform continues to propagate through circuits nodes X, SAEN, H, and BUSEN, thus generating the bus and sense amp enable signals corresponding to the last valid address signal. FIG. 5 illustrates an operational mode wherein two address signals are received in a short time interval, approximately 8 nanoseconds apart. The delayed and inverted signal appears at nodes B and X1 having two distinct pulses. However, the "earlier" pulse is effectively "killed" by the time the wavefront arrives at circuit node X. Recall that the waveform at circuit node X represents the logical AND function of the waveforms at nodes EQSX* and X1. Since the EQSX* signal is in transition during the duration of the earlier pulse in waveform X1, the pulse is effectively killed. The waveform at node X propagates through the remaining circuit nodes, generating a single pulse SAEN and BUSEN signals in response to the dual pulse input waveform. FIGS. 6 and 7 are essentially duplicative of the waveforms shown in FIG. 5. However, since the two pulses of the input waveform are further spaced apart, the earlier pulse is not killed until node SAEN in FIG. 7, and at node BUSEN in FIG. 8. The effect of having a two pulse SAEN signal and a one pulse BUSEN signal as shown in FIG. 8 is that the sense amp is powered up twice, but the internal data bus is only driven once by the BUSEN signal. A small increase in power results in the condition depicted in FIG. 8. In FIG. 9, the two pulses of the input waveform are spaced apart by a sufficient time interval that two pulse SAEN and BUSEN signals are generated.

Having described and illustrated the principles of the invention in a preferred embodiment thereof, it is apparent to those skilled in the art that the invention can be modified in arrangement and detail without departing from such principles. For example, the exact number of AND gate stages, delay of each stage, and the number and configuration of additional gating control signals will depend largely upon the exact configuration and timing required of the memory circuit in which the control circuit is used. Further, while it is apparent to those skilled in the art that timing and control circuit of the present invention is ideally suited for operating with an asynchronously generated address transition detection signal, the same timing and control circuit can be used with address transition detection signals that are generated synchronously with the memory clock signal. We therefore claim all modifications and variation coming within the spirit and scope of the following claims.

What is claimed is:

1. A method of operating a memory comprising the steps of:
   (a) providing an input address bus;
   (b) providing a memory circuit including a memory array and coupled sense amplifiers, the sense amplifiers further including internal sense amplifier enable and output data bus enable nodes;
   (c) generating an address transition signal from a series of address signals received on the input address bus, the address transition signal including a pulse train of two or more pulses;
   (d) generating fixed pulse width sense amplifier enable and output data bus enable signals corresponding to the last pulse in the pulse train of the address transition signal if the pulses are spaced apart by less than a predetermined time interval; and
   (e) generating fixed pulse width sense amplifier enable and output data bus enable signals corresponding to each pulse in the pulse train of the address transition signal if the pulses are spaced apart by more than the predetermined time interval.

2. The method of claim 1 in which the step of generating an address transition signal comprises generating an asynchronous address transition signal.

3. The method of claim 1 further comprising the step of synchronizing the sense amplifier enable and bus enable signals with other gating control signals in addition to the address transition signal.

4. A method of operating a memory comprising the steps of:
   (a) providing an input address bus;
   (b) providing a memory circuit including a memory array and coupled sense amplifiers, the sense amplifiers further including internal sense amplifier enable and output data bus enable nodes;
   (c) generating an address transition signal from a series of address signals received on the input address bus, the address transition signal comprising a single pulse having a variable pulse width related to the number of different address signals received on the address bus; and
   (d) generating fixed pulse width sense amplifier enable and output data bus enable signals corresponding to the single pulse of the address transition signal.

5. The method of claim 4 in which the step of generating an address transition signal comprises the step of generating an asynchronous address transition signal.

6. The method of claim 4 further comprising the step of synchronizing the sense amplifier enable and bus enable signals with other gating control signals in addition to the address transition signal.

* * * * *